US009865776B2

(12) United States Patent
Zini et al.

(10) Patent No.: US 9,865,776 B2
(45) Date of Patent: Jan. 9, 2018

(54) METHOD FOR SEPARATING REGIONS OF A SEMICONDUCTOR LAYER

(71) Applicant: OSRAM Opto Semiconductors GmbH, Regensburg (DE)

(72) Inventors: Lorenzo Zini, Regensburg (DE); Bernd Boehm, Obertraubling (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/413,281

(22) Filed: Jan. 23, 2017

(65) Prior Publication Data
US 2017/0133555 A1  May 11, 2017

Related U.S. Application Data

(63) Continuation of application No. 14/430,872, filed as application No. PCT/EP2013/070042 on Sep. 26, 2013, now Pat. No. 9,589,943.

(30) Foreign Application Priority Data

Sep. 27, 2012  (DE) .......... 10 2012 217 524
Nov. 15, 2012  (DE) .......... 10 2012 220 909

(51) Int. Cl.
*H01L 31/101* (2006.01)
*H01L 21/00* (2006.01)
(Continued)

(52) U.S. Cl.
CPC ............ *H01L 33/24* (2013.01); *H01L 25/167* (2013.01); *H01L 33/0095* (2013.01); *H01L 33/20* (2013.01); *H01L 2924/0002* (2013.01)

(58) Field of Classification Search
CPC .................................................. H01L 25/167
(Continued)

(56) References Cited

U.S. PATENT DOCUMENTS 8,044,474 B2    10/2011  Blumel
8,664,679 B2 *   3/2014  Yan .......................... H01L 33/22
                                                                257/98
(Continued)

FOREIGN PATENT DOCUMENTS

CN      1732575 A     2/2006
CN    101878521 A    11/2010
(Continued)

*Primary Examiner* — Calvin Lee
(74) *Attorney, Agent, or Firm* — McDermott Will & Emery LLP

(57) ABSTRACT

The invention relates to a method for separating regions of a semiconductor layer and for introducing an outcoupling structure into an upper side of the semiconductor layer, the outcoupling structure being provided to couple light out of the semiconductor layer. The upper side of the semiconductor layer is covered by a mask having first openings for introducing the outcoupling structure and at least a second opening, which is provided to introduce a separating trench into the semiconductor layer. With the aid of an etching method, the outcoupling structure is introduced into the upper side of the semiconductor layer in the region of the first openings and simultaneously a separating trench passing through the semiconductor layer is introduced into the semiconductor layer via the second opening, and a region of the semiconductor layer is separated.

10 Claims, 3 Drawing Sheets

Figure 3:
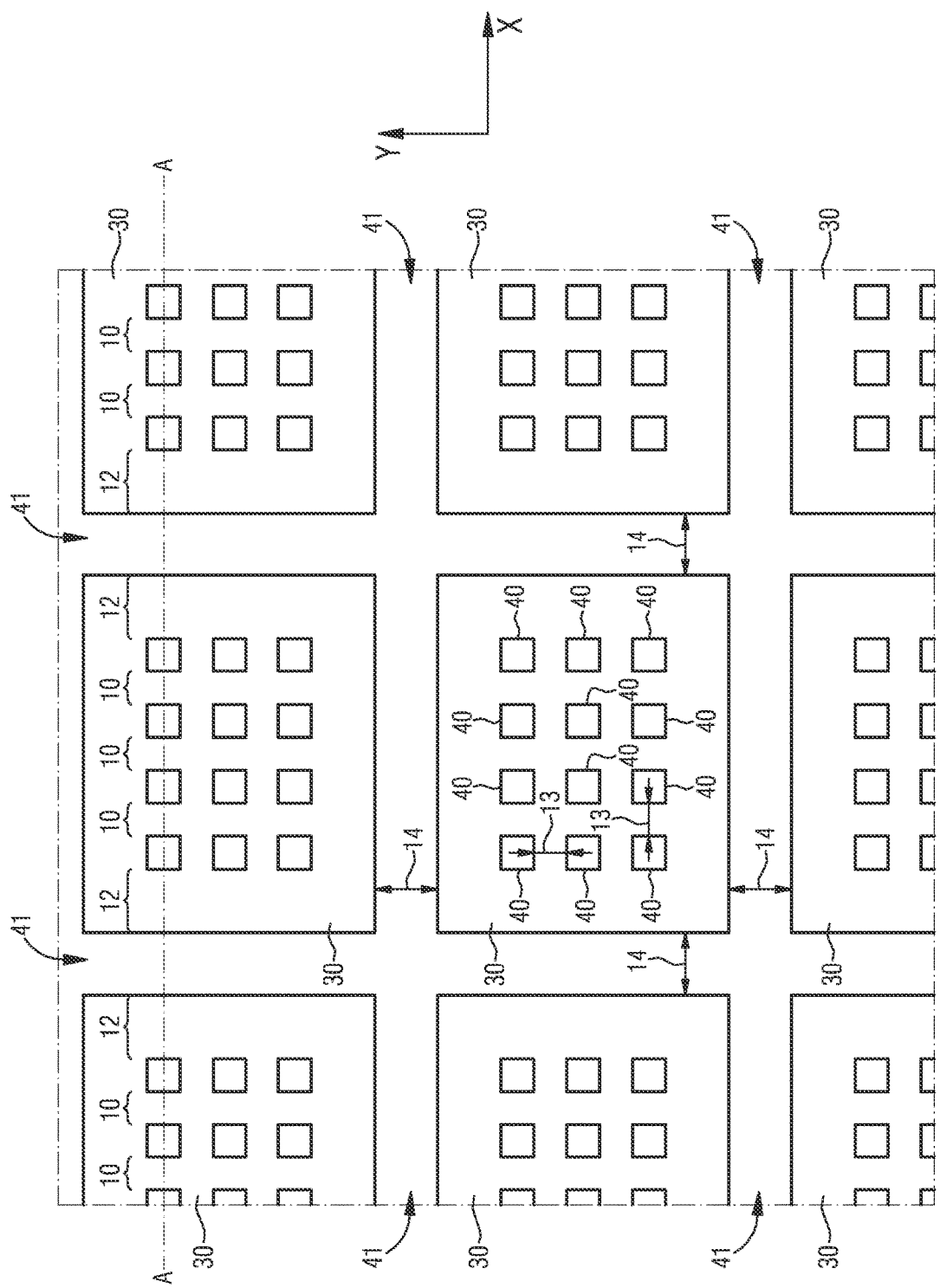

(51) Int. Cl.
*H01L 33/24* (2010.01)
*H01L 25/16* (2006.01)
*H01L 33/00* (2010.01)
*H01L 33/20* (2010.01)

(58) Field of Classification Search
USPC ............................ 438/28, 78; 257/113–114
See application file for complete search history.

(56) References Cited

U.S. PATENT DOCUMENTS

| | | | |
|---|---|---|---|
| 9,508,903 B2 * | 11/2016 | Fehrer | H01L 24/24 |
| | | | 33/44 |
| 9,589,943 B2 * | 3/2017 | Zini | H01L 33/0095 |
| | | | 257/113 |
| 2003/0132445 A1 | 7/2003 | Yoshitake et al. | |
| 2009/0200563 A1 | 8/2009 | Goshonoo et al. | |
| 2011/0156064 A1 | 6/2011 | Seo et al. | |
| 2012/0013985 A1 | 1/2012 | Graeupner | |
| 2012/0070927 A1 | 3/2012 | Baur et al. | |
| 2012/0138985 A1 | 6/2012 | Ono et al. | |
| 2012/0273824 A1 | 11/2012 | Gmeinwieser et al. | |
| 2012/0326178 A1 | 12/2012 | Fehrer et al. | |

FOREIGN PATENT DOCUMENTS

| | | |
|---|---|---|
| CN | 102593288 A | 7/2012 |
| DE | 102009023355 A1 | 12/2010 |
| DE | 102011003684 A1 | 8/2012 |
| DE | 102011010503 A1 | 8/2012 |
| DE | 102011012608 A1 | 8/2012 |
| EP | 2360748 A2 | 8/2011 |
| JP | 2001201647 A | 7/2001 |
| JP | 2003-209283 A | 7/2003 |
| JP | 2005116615 A | 4/2005 |
| JP | 2005129917 A | 5/2005 |
| JP | 2007207981 A | 8/2007 |
| JP | 2007288106 A | 11/2007 |
| JP | 2009130027 A | 6/2009 |
| JP | 2009170611 A | 7/2009 |
| JP | 2009218569 A | 9/2009 |
| JP | 2011139038 A | 7/2011 |
| JP | 2012124257 A | 6/2012 |
| WO | WO-2009084325 A1 | 7/2009 |

\* cited by examiner

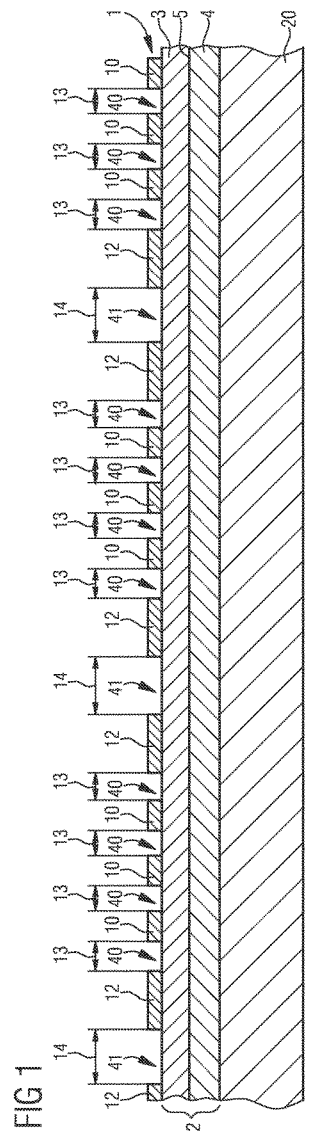
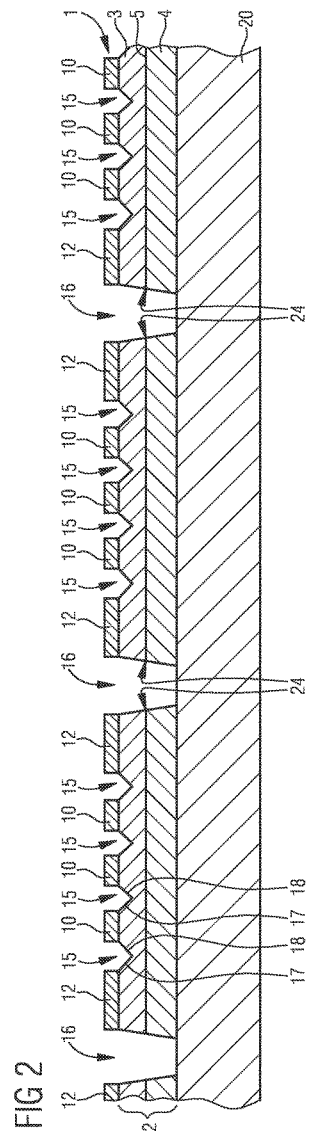

METHOD FOR SEPARATING REGIONS OF A SEMICONDUCTOR LAYER

CROSS-REFERENCE TO RELATED APPLICATION

This application is a continuation of U.S. application Ser. No. 14/430,872, filed Mar. 24, 2015, now U.S. Pat. No. 9,589,943 issued Mar. 7, 2017, which is a national stage application of International Patent Application No. PCT/EP2013/070042, filed Sep. 26, 2013, which claims the benefit of priority to German Patent Application No. 102012217524.5, filed on Sep. 27, 2012 and German Patent Application No. 102012220909.3, filed on Nov. 15, 2012, all of which are hereby incorporated by reference in their entirety for all purposes.

DESCRIPTION

The invention relates to a method for separating regions of a semiconductor layer according to patent claim 1 and to an optoelectronic semiconductor chip according to claim 8.

DE 10 2011 010 503 A1 discloses providing a semiconductor layer of an optoelectronic semiconductor chip with a mask and introducing a coupling-out structure into a coupling-out side of the semiconductor layer. Afterward, the mask is removed and, with the aid of a second mask, likewise by means of an etching method, the semiconductor layer is separated into individual regions from which individual semiconductor chips are produced later.

The object of the invention is to provide a simpler and faster method for separating regions of a semiconductor layer and for introducing a coupling-out structure into the semiconductor layer.

The object is achieved by means of the method according to claim 1 and the semiconductor chip according to claim 10. Further advantageous embodiments are specified in the dependent claims.

The method described has the advantage that, just with one mask and in one method step, the coupling-out structure is introduced into the semiconductor layer and at the same time at least one region of the semiconductor layer is separated. Consequently, the method described is simple, cost-effective and fast to carry out. In contrast to the prior art, it is not necessary to use a plurality of masks and/or to carry out a plurality of etching methods. By way of example, an optoelectronic semiconductor chip having a semiconductor layer for generating light is produced with the aid of the method described. As a result of the simultaneous roughening and the introduction of a trench around the semiconductor chip, i.e. the mesa etching, a non-roughened edge is obtained around the semiconductor chip. On account of this sharp chip edge, the chip edge can be monitored more easily for defects or contaminants in a concluding optical inspection. The reliability of the optical inspection is increased as a result.

In the prior art, the chip edge is also roughened and, as a result, the chip edge appears very wavy in the inspection, such that a clear definable boundary for the automatic inspection can be recognized only with difficulty.

In one embodiment, the mask is applied in one method step and thus has a uniform thickness.

In one development, a hard mask is used as the mask. The hard mask is simple to produce, cost-effective and enables an accurate structuring of the coupling-out structure and of the separation of a region of the semiconductor layer.

In a further embodiment, the hard mask is a resist mask.

In a further embodiment, a gaseous or liquid etching medium is used as etchant. The use of gaseous or liquid etching media constitutes a known technology and enables the method to be carried out cost-effectively.

In a further embodiment, the etching method is a dry etching method.

In a further embodiment, a plasma is used in the dry etching method. By way of example, this involves a Cl plasma.

The method described is particularly suitable for introducing a coupling-out structure into an epitaxially applied semiconductor layer. By way of example, the epitaxially grown semiconductor layer can be embodied in the form of a gallium nitride layer.

In a further embodiment, after the removal of the mask, a further structuring step is carried out in order to provide the previously covered regions of the semiconductor layer with a coupling-out structure. The efficiency for coupling out light is improved in this way.

Figure 4:
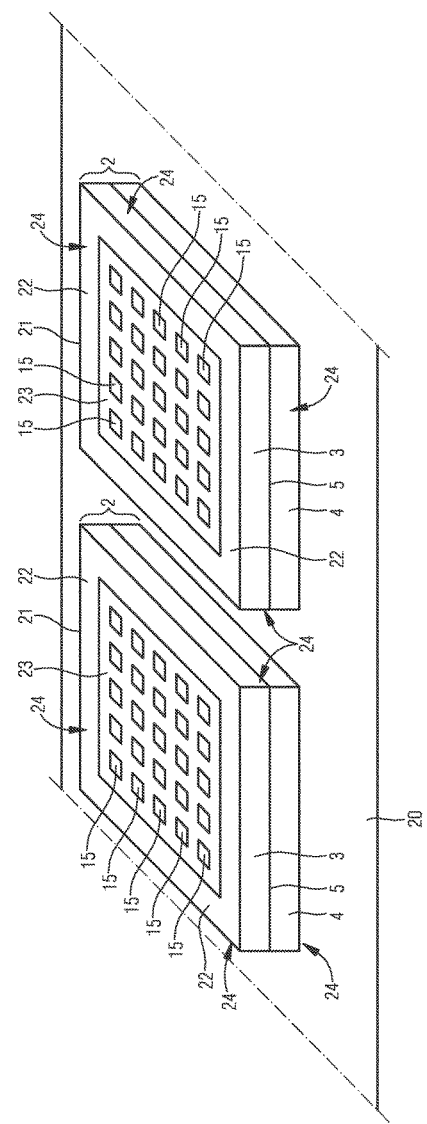

The above-described properties, features and advantages of this invention and the way in which they are achieved will become clearer and more clearly understood in association with the following description of the exemplary embodiments which are explained in greater detail in association with the drawings, wherein FIG. 1 shows a first method step in a schematic illustration, FIG. 2 shows a second method step in a schematic illustration, FIG. 3 shows a schematic plan view of a semiconductor layer with a mask, and FIG. 4 shows a schematic illustration of semiconductor chips.

FIG. 1 shows a schematic sectional view of a semiconductor layer 2, on the top side of which a structured mask 1 is applied. The semiconductor layer 2 can be arranged on a carrier 20, as illustrated. The carrier 20 can for example comprise Ge, Si, GaAs, AlN or SiN or consist of a corresponding layer composed of Ge, Si, GaAs, AlN or SiN. The mask 1 is embodied in the form of a hard mask for example. The hard mask can comprise silicon nitride or silicon oxide, for example. Furthermore, the hard mask can also be a resist mask. The structuring of the mask is performed by means of a lithographic method using photoresist and corresponding etching media. By way of example, an etching process using hydrofluoric acid (HF) or an ammonia-buffered hydrofluoric acid can be carried out for structuring or for removing the mask.

The semiconductor layer 2 comprises an upper first doped semiconductor layer 3, for example. Adjoining the first semiconductor layer 3, a second doped semiconductor layer 4 is provided. The first semiconductor layer 3 can be negatively doped and the second semiconductor layer 4 can be positively doped. Equally, the first semiconductor layer 3 can be positively doped and the second semiconductor layer 4 can be negatively doped. An active zone 5 for generating light is formed in the boundary region between the first and second semiconductor layers 3, 4. More complex layer structures for the formation of an active zone 5 can also be provided depending on the embodiment chosen. In particular, the active zone 5 can be formed from a sequence of layers having different dopings. The semiconductor layer 2 constitutes for example an optoelectronic semiconductor layer, in particular an LED semiconductor chip.

The structured mask 1 is applied on the first semiconductor layer 3. Depending on the embodiment chosen, the semiconductor layer 2 can also comprise other or additional layers, in particular a mirror layer.

The mask 1 has first mask elements 10 and second mask elements 12. A first opening 40 is in each case provided between a first mask element 10 and a further first mask element 10, or between a first mask element 10 and a second mask element 12. The width of the first opening 40, i.e. a first distance 13 between a first mask element 10 and a further first mask element 10 or between a first mask element 10 and a second mask element 12, is in a first range. By way of example, the first distances 13 between two first mask elements 10 and a first mask element 10 and a second mask element 12 are identical in magnitude. The second mask element 12 is arranged in each case circumferentially around a region of the semiconductor layer 2. The second mask element 12 can have a width of 10 µm to 5 µm, for example.

The first mask elements 10 preferably have the same width along an x-axis illustrated in FIG. 1. The width of the second mask element 12 along the x-axis is greater than the width of the first mask elements 10 along the x-axis. A second opening 41 is provided between two second mask elements 12. The second opening 41 has a greater second width 14 than the first opening 40 in the x-axis. Consequently, two adjacent second mask elements 12 have a greater second distance 14 than two adjacent first mask elements 10. Moreover, two adjacent second mask elements 12 have a greater second distance 14 than a second mask element 12 from a first mask element 10. The first distance 13 is thus less than the second distance 14. The first distance 13 is defined in such a way that, during an etching process, a desired cutout is introduced into the semiconductor layer 2, which constitutes a part of an optical coupling-out structure. The second distance 14 is chosen in such a way that simultaneously during the etching process for introducing the optical coupling-out structure a separating trench is introduced into the semiconductor layer 2, said separating trench extending through the entire thickness of the semiconductor layer 2. The second distance can be between 1.5 µm and 2.5 µm, for example. The magnitude of the second distance 14 depends on the thickness and the material of the semiconductor layer 2 and on the etching method used, in particular on the etching medium. The etching medium used can be for example KOH or phosphoric acid for a wet-chemical etching method.

FIG. 2 shows the arrangement from FIG. 1 after the etching process has been carried out. Between two first mask elements 10 and between a first mask element 10 and a second mask element 12, in each case a cutout 15 is introduced into the semiconductor layer 2. Moreover, between two second mask elements 12, a separating trench 16 is introduced into the semiconductor layer 2.

The cutouts 15 have boundary surfaces 17, 18 that support a coupling-out of light generated by the active zone 5. The separating trench 16 extends over the entire thickness of the semiconductor layer 2. If the separating trench 16 is embodied as a closed ring in the plane of the semiconductor layer 2, then a first and a second region 19, 20 of the semiconductor layer 2 are separated, as a result of the formation of the separating trench 16 i.e. a mesa etching is carried out. A region of the semiconductor layer 2 is separated by the separating trench 16, as a result of which a semiconductor chip such as e.g. an LED chip is separated. In the case where a carrier 20 is provided, the individual regions of the carrier 20 can be separated by a further etching method and/or by a laser separating method along the separating trench 16. An optoelectronic semiconductor chip, in particular an LED having a region of the semiconductor layer can be produced after the separation of the regions of the semiconductor layer.

The boundary surfaces 17, 18 arranged in an inclined manner reduce that proportion of electromagnetic radiation which is subjected to total internal reflection at the outer surface of the layer 2. The boundary surfaces 17, 18 form an angle of for example 35° to 75°, preferably 50° to 70°, with the plane of the layer 2. The concrete angle is predefined by a crystal direction of the doped first semiconductor layer 3 and the chemical removal. The etching depth, i.e. the depth of the cutouts 15, can be in the micrometers range. The cutouts 15 can have pyramidal depressions. In the case of an etching depth in the micrometers range and in the case of angles from above ranges of values, the cutouts 15 have the shape of pyramids which are particularly suitable for coupling out electromagnetic radiation in the visible wavelength range, that is to say at wavelengths of between 0.3 µm and approximately 0.8 µm. The diameter of a base of the pyramidal cutouts 15 is likewise in the micrometers range. The diameter is thus significantly greater than the wavelength of the electromagnetic radiation. The base of the pyramidal cutout has a hexagonal shape, in the case of the embodiment of the first semiconductor layer 3 composed of gallium nitride. After the removal of the mask 1, a plurality of separated semiconductor chips are obtained, wherein a central region of each semiconductor chip is roughened. The roughened central region is surrounded by a smooth, non-roughened edge which was covered by the second mask element 12 during the etching.

In a further embodiment, the mask 1 is subsequently removed and the then uncovered regions of the surface of the first semiconductor layer 3 are roughened by means of a further etching step. The regions covered in the first etching step are thus also provided with a coupling-out structure.

The semiconductor layer can be embodied as an epitaxially grown layer structure having a plurality of layers. In this case, the individual layers can consist of a III-V semiconductor material. By way of example, a layer of the semiconductor layer can be embodied on the basis of GaN, GaInN or AlN. Moreover, a layer can be constructed on the basis of InGaAlN. InGaAlN-based layer structures include, in particular, those in which the epitaxially produced layer structure generally comprises a layer sequence composed of different individual layers which contains at least one individual layer comprising a material from the III-V compound semiconductor material system $In_xAl_yGa_{1-x-y}N$ where $0 \leq x \leq 1$, $0 \leq y \leq 1$ and $x+y \leq 1$. The layer structure comprising at least one active layer or an active region on the basis of InGaAlN can emit for example electromagnetic radiation in an ultraviolet to green wavelength range.

Alternatively or additionally, the layers of the semiconductor layer can also be based on InGaAlP, that is to say that the layer structure can comprise different individual layers, at least one individual layer of which comprises a material from the III-V compound semiconductor material system $In_xAl_yGa_{1-x-y}P$ where $0 \leq x \leq 1$, $0 \leq y \leq 1$ and $x+y \leq 1$. The layer structure comprising at least one active layer or an active region on the basis of InGaAlP can for example preferably emit electromagnetic radiation having one or more spectral components in a green to red wavelength range.

Alternatively or additionally, the layers of the semiconductor layer can also comprise other III-V compound semiconductor material systems, for example an AlGaAs-based material, or II-VI compound semiconductor material systems. In particular, an active layer comprising an AlGaAs-based material can be suitable for emitting electromagnetic radiation having one or more spectral components in a red to infrared wavelength range. A II-VI compound semiconductor material system can comprise at least one element from the second main group, such as Be, Mg, Ca, Sr, for example, and an element from the sixth main group, such as O, S, Se, for example. In particular, a II-VI compound semiconductor material system comprises a binary, ternary or quaternary compound comprising at least one element from the second main group and at least one element from the sixth main group. Such a binary, ternary or quaternary compound can moreover comprise for example one or a plurality of dopants and additional constituents. By way of example, the II-VI compound semiconductor materials include ZnSe, ZnTe, ZnO, ZnMgO, ZnS, CdS, ZnCdS, MgBeO.

FIG. 3 shows, in a schematic illustration, a plan view of a semiconductor layer 2 provided with a mask 1. The mask 1 is embodied in the form of a plurality of mask regions 30. Each mask region 30 covers a region of the semiconductor layer 2 that is separated by the subsequent etching process of the semiconductor chip. In the exemplary embodiment illustrated, the mask 1 has identical mask regions 30. Each mask region 30 is embodied identically and has substantially a rectangular mask layer, in which 12 first openings 40 are introduced in each case. In the exemplary embodiment illustrated, in each case four first openings 40 are arranged alongside one another, three rows of four first openings 40 being provided. In each case two mask regions 30 are separated from one another by a second opening 41. The second openings 41 form a right-angled strip pattern. In each case two mask regions 30 are at a second distance 14 from one another both in an x-axis and in a y-axis. The x-axis and the y-axis are perpendicular to one another and are depicted schematically in FIG. 3. The first openings 40 have a first distance 13 in each case both in the x-direction and in the y-direction. What is achieved by the second openings 41 is that the semiconductor layer 2 is severed between the mask regions 30 as a result of the formation of the separating trench during the etching process carried out and explained with reference to FIG. 2, i.e. individual semiconductor chips of the semiconductor layer 2 are separated. Moreover, through the first openings 40, corresponding pyramidal cutouts 15 are introduced into the semiconductor layer 2, i.e. a central region of the semiconductor chip is roughened. The central region is surrounded by a smooth, non-roughened region. In FIG. 3, a sectional line corresponding to the sectional illustration in FIG. 1 is depicted by A-A.

Depending on the embodiment chosen, the mask 1 can also have a different structure, wherein the second distances 14 are chosen between adjacent mask regions in such a way that the semiconductor layer 2 is provided with corresponding circumferential separating trenches 16 passing through the entire semiconductor layer 2 during the etching of the coupling-out structure.

FIG. 4 shows a schematic illustration of a carrier 20, on which two semiconductor chips 21 were structured from a semiconductor layer 2 in accordance with the method described. Each semiconductor chip 21 has on a top side a central region 23 surrounded by an edge region 22. The central region 23 has the coupling-out structure in the form of a cutout 15, which were introduced into the top side of the semiconductor layer 2 with the aid of the mask and the first openings 40. The central region 23 is thus roughened. The edge region 22 was covered by a circumferential edge region of the etching mask of the second mask element 12 during the etching process and is therefore not roughened. This has the effect that the smooth edge region 22 can be distinguished optically more easily from the roughened edge region 23. Consequently, a sharp chip edge is identified optically, as a result of which an optical inspection can easily be carried out automatically. An optical inspection is necessary for example for checking for defects or contaminants. Each semiconductor chip 21 is surrounded by a circumferential, etched edge region 24. The edge region 24 was etched simultaneously with the coupling-out structure.

Although the invention has been more specifically illustrated and described in detail by means of the preferred exemplary embodiment, nevertheless the invention is not restricted by the examples disclosed, and other variations can be derived therefrom by the person skilled in the art, without departing from the scope of protection of the invention.

LIST OF REFERENCE SIGNS

1 Mask
2 Semiconductor layer
3 $1^{st}$ semiconductor layer
4 $2^{nd}$ semiconductor layer
5 Active zone
10 $1^{st}$ mask element
12 $2^{nd}$ mask element
13 $1^{st}$ distance
14 $2^{nd}$ distance
15 Cutout
16 Separating trench
17 $1^{st}$ boundary surface
18 $2^{nd}$ boundary surface
20 Carrier
21 Semiconductor chips
22 Edge region
23 Central region
24 Edge region
30 Mask region
40 $1^{st}$ opening
40 $2^{nd}$ opening
42 Edge

The invention claimed is:

1. An optoelectronic semiconductor chip, comprising:
a semiconductor layer having an active zone for generating light;
a coupling-out structure for coupling out light;
a separating trench around a region of the semiconductor layer; and
a circumferential etched edge region,
wherein the separating trench is introduced over the entire thickness of the semiconductor layer.

2. The optoelectronic semiconductor chip according to claim 1, wherein the coupling-out structure is roughened and in a central region, and
wherein the central region is surrounded by a non-roughened edge region.

3. The optoelectronic semiconductor chip according to claim 1, wherein the top side of the semiconductor layer is provided with a coupling-out structure by means of an etched surface.

4. The optoelectronic semiconductor chip according to claim 1, wherein the semiconductor layer comprises an epitaxially applied layer at least at the top side.

5. The optoelectronic semiconductor chip according to claim 1, wherein the semiconductor layer comprises at least one active layer on the basis of InGaAlN.

6. The optoelectronic semiconductor chip according to claim 1, wherein the semiconductor layer comprises at least one GaN layer.

7. The optoelectronic semiconductor chip according to claim 1, wherein the coupling out structure comprises cutouts in the semiconductor layer.

8. The optoelectronic semiconductor chip according to claim 7, wherein the cutouts have pyramidal depressions.

9. The optoelectronic semiconductor chip according to claim 8, wherein the base of a pyramidal cutout has a hexagonal shape.

10. An optoelectronic semiconductor chip, comprising:
a semiconductor layer having an active zone for generating light;
a roughened coupling-out structure in a central region for coupling out light;
a separating trench around a region of the semiconductor layer; and
a circumferential etched edge region,
wherein the central region is surrounded by a non-roughened edge region.

* * * * *